(12) United States Patent
Sutton et al.

(10) Patent No.: US 6,807,506 B2
(45) Date of Patent: Oct. 19, 2004

(54) ELECTRONIC TEST PROGRAM WITH TEST TRIGGERED INTERACTIVE DISPLAYS

(75) Inventors: Christopher K Sutton, Everett, WA (US); Richard Mills, Seattle, WA (US)

(73) Assignee: Agilent Technologies, Inc., Palo Alto, CA (US)

( * ) Notice: Subject to any disclaimer, the term of this patent is extended or adjusted under 35 U.S.C. 154(b) by 123 days.

(21) Appl. No.: 10/102,088

(22) Filed: Mar. 20, 2002

(65) Prior Publication Data

US 2003/0182075 A1 Sep. 25, 2003

(51) Int. Cl.$^7$ ............................................. G01M 19/00
(52) U.S. Cl. ............................. 702/123; 714/46
(58) Field of Search ............................ 702/123; 714/46

(56) References Cited

U.S. PATENT DOCUMENTS

| | | | |
|---|---|---|---|
| 5,107,498 A | * 4/1992 | Hagihara et al. | 714/36 |
| 5,313,156 A | * 5/1994 | Klug et al. | 324/158.1 |
| 5,390,131 A | 2/1995 | Rohrbaugh et al. | |
| 5,582,796 A | * 12/1996 | Carey et al. | 422/65 |
| 5,589,350 A | * 12/1996 | Bochner | 435/29 |
| 5,589,765 A | * 12/1996 | Ohmart et al. | 324/158.1 |
| 5,638,418 A | * 6/1997 | Douglass et al. | 377/25 |
| 6,002,992 A | 12/1999 | Pauwels et al. | |
| 6,029,257 A | * 2/2000 | Palmer | 714/40 |
| 6,128,759 A | * 10/2000 | Hansen | 714/738 |
| 6,134,674 A | * 10/2000 | Akasheh | 714/33 |
| 6,299,840 B1 | * 10/2001 | Watanabe et al. | 422/63 |
| 6,397,378 B1 | * 5/2002 | Grey et al. | 717/175 |
| 6,401,220 B1 | * 6/2002 | Grey et al. | 714/33 |
| 6,442,714 B1 | * 8/2002 | Griffin et al. | 714/46 |
| 6,449,744 B1 | * 9/2002 | Hansen | 714/738 |
| 6,473,707 B1 | * 10/2002 | Grey | 702/123 |
| 6,577,981 B1 | * 6/2003 | Grey et al. | 702/119 |

OTHER PUBLICATIONS

Case, Stanley P. et al, "A Path to Superior Testing in the 21st Century", Proceedings of the AUTOTESTCON 1995, IEEE, Aug. 8–10, 1995, pp. 219–226, XP002258946.

Czapaki, Joseph, "Useful Features of Automated Test Systems in the R&D Laboratory", Proceedings of the AUTOTESTCON 2000, IEEE, Sep. 18–21, 2000, pp. 601–613, XP002256433.

National Instruments, "TestStand—A Complete Test Executive Environment," National Instruments, p. 55–60 (Mar., 2000).

* cited by examiner

*Primary Examiner*—John Barlow
*Assistant Examiner*—Anthony T. Dougherty

(57) ABSTRACT

A test executive system for controlling a test upon a device under test that is distinct and separate from said test executive system. The test executive system provides interactive dialog boxes in the following manner. A signal that an event in a testing procedure occurs is received. A file storing testing information is retrieved responsive to the signal. The testing information includes directions for the user to perform an action required to continue the test. The test executive system includes a web browser and the test information may comprise a web page. The testing information is displayed along with at least one input option. An input is then received from the user. The input is then processed responsive to receiving said input.

15 Claims, 6 Drawing Sheets

ELECTRONIC TEST PROGRAM WITH TEST TRIGGERED INTERACTIVE DISPLAYS

BACKGROUND OF THE INVENTION

1. Field of the Invention

This invention relates to an electronic system for performing automated testing of complex electronic, electro-mechanical, and mechanical devices, and more particularly to a computerized test system that is capable of controlling a variety of automated tests.

2. Statement of the Problem

Complex electronic, electro-mechanical and mechanical devices are generally tested using automated test systems. The tests may include validation tests which run through the various operations of a device under test (DUT) and records whether each operation was performed properly. The tests may also include environmental tests which expose the DUT to various combinations of temperature, pressure, and humidity to record the results of operations as the environment changes. Other tests, such as production tests, may also be completed. Generally, both the DUT and the systems providing the environmental and other constraints on the DUT are controlled electronically. In the last decade or so, computerized programs which are capable of controlling a variety of automated tests, referred to in the art as "test executive" programs, have been developed.

Tests usually are defined by a set of rules or specifications to which the DUT is compared. The rules or specifications generally comprise various inputs defined by electrical and mechanical parameters applied to the DUT, such as voltage, current, specified manipulations of controls and device parts, as well as environmental parameters under which the test is conducted, such as temperature, humidity, pressure, and the time period over which a parameter is applied. Each test will include many combinations of the parameters applied to each element of the DUT, and often will be repeated many times. Each combination of parameters will define a measurement that results in one or more datapoints, which are recorded and compared to numerical or Boolean limits defining the specifications. Thus, as devices become more complex, electronic test programs have become very long and complex, often requiring several days, or even a week or more to run a complete test.

Test executive programs in the prior art include internal test executive programs developed by Agilent Technologies and TESTSTAND software developed by National Instruments Corporation, which is described as a ready-to-run test executive for organizing, controlling, and executing automated prototype, validation, or production test systems. During execution, the prior art test executive program halts during testing to allow connections to be rearranged, settings to be changed, parameter modifications, etc. After all of the changes are made, the test executive program resumes operation. However, a user may not know which of several stop points had been reached by the test program, or how to configure the test equipment and device to allow the test executive program to continue. This can cause long and unacceptable delays in the testing process. It can also result in errors that require tests to be repeated. Therefore, there is a need in the art for a more effective way to enable a user to make desired modifications.

3. Summary of the Invention

The above and other problems are solved and an advance in the art is made by an electronic test executive system with interactive electronic displays in accordance with this invention. The test executive system according to the invention displays testing information upon the occurrence of predetermined test events. The test information comprises directions for a user of the test executive system to perform an action required to continue a test. A first advantage of this invention is that testing information can be displayed in an easy-to-grasp manner. A second advantage of this invention is that the displayed testing information preferably allows a user to easily determine at which point the test has halted. A third advantage is that instructions about how to configure testing equipment, a device under test, or parameters are preferably displayed to the user to allow easier set up for further testing. A fourth advantage is that it is easy for the test developer to create the content of the displays.

The present invention is preferably an application executed by a processing unit. One skilled in the art will recognize that instructions for such an application may be stored in a memory as software instructions, and/or as firmware in a memory affixed to a processing chip. The application of this invention is executed in the following manner. The application receives a signal that an event in a testing procedure occurs. For purposes of the present discussion, an event is a point were modifications must be made to a DUT or environmental equipment to enable the test to continue or some other stopping point in a test procedure, a point in a testing procedure when data must be shown, an end point in a test measurement, a test procedure, or a test, or any other event in a test which requires a display of information to a user. Testing information pertaining to the event is retrieved. For purposes of this discussion, testing information includes, but is not limited to, instructions about how to reconfigure the DUT and/or environmental equipment, parameters used to process a test, measurements of results, or any other information which must be displayed at a certain point in the testing procedure. The application then displays the testing information. In a preferred embodiment, the testing information is displayed in a dialog box.

Alternatively, the testing information may be stored remotely from the processing unit. For example, the testing unit may be stored in a Hyper Text Markup Language (HTML) format on a remote computer system. In this case, the processing system opens a conventional web browser application which can retrieve and display the testing information.

The testing information preferably includes an input command or commands. This portion of the testing information may be displayed with the other testing information or separately. For example, input commands may be shown as buttons in the dialog box and the user may "click" the desired one of the input commands using a mouse or other pointing device. The application then receives a signal from the user indicating the desired input. The desired input is then processed to perform the selected command. After the desired input is processed, the application may close the display.

To display the test information, the application preferably determines a format in which the testing information is stored. Then the application executes an application that displays the testing information in the proper format. For example, the testing information maybe in an HTML format. The test information may be in an HTML format because the testing information contains pictures and instructions about how to configure the equipment and/or device. In this case, the application preferably opens a web browser application to retrieve and display the testing information. In another example, the test information may be text in an ASCII format. The application, in this case, preferably opens a dialog box and displays the ASCII text.

Some of the input commands that may be displayed to a user include a continue running test command, an abort command, a skip measurement command, a skip test command, an O.K. command, and a print command. The user may then select one of the inputs displayed. In a preferred embodiment, the input is selected by the user "clicking" on a button representing the command. For example, the user "clicks" on an O.K. button to indicate that the user has completed an instruction or reviewed the information.

When a user inputs a continue running test command, the application preferably ends and allows the executive test program to resume tests being performed on a device. When a user inputs an abort command, the application preferably signals the executive test program to halt the test procedure being performed. When a skip measurement command is received from the user, the application preferably signals the executive test program to not make an indicated measurement during a test being executed by the test executive program. When a skip test command input is received, the application signals the test executive program to not perform a specified test. When an O.K. command input is received, the application preferably signals the test executive program to resume executing the tests. When a print command input is received, the application preferably prints the test information on the screen or to some other output device.

The above and other advantages of this invention are set forth in the below Detailed Description and the following drawings.

DETAILED DESCRIPTION

Figure 1:
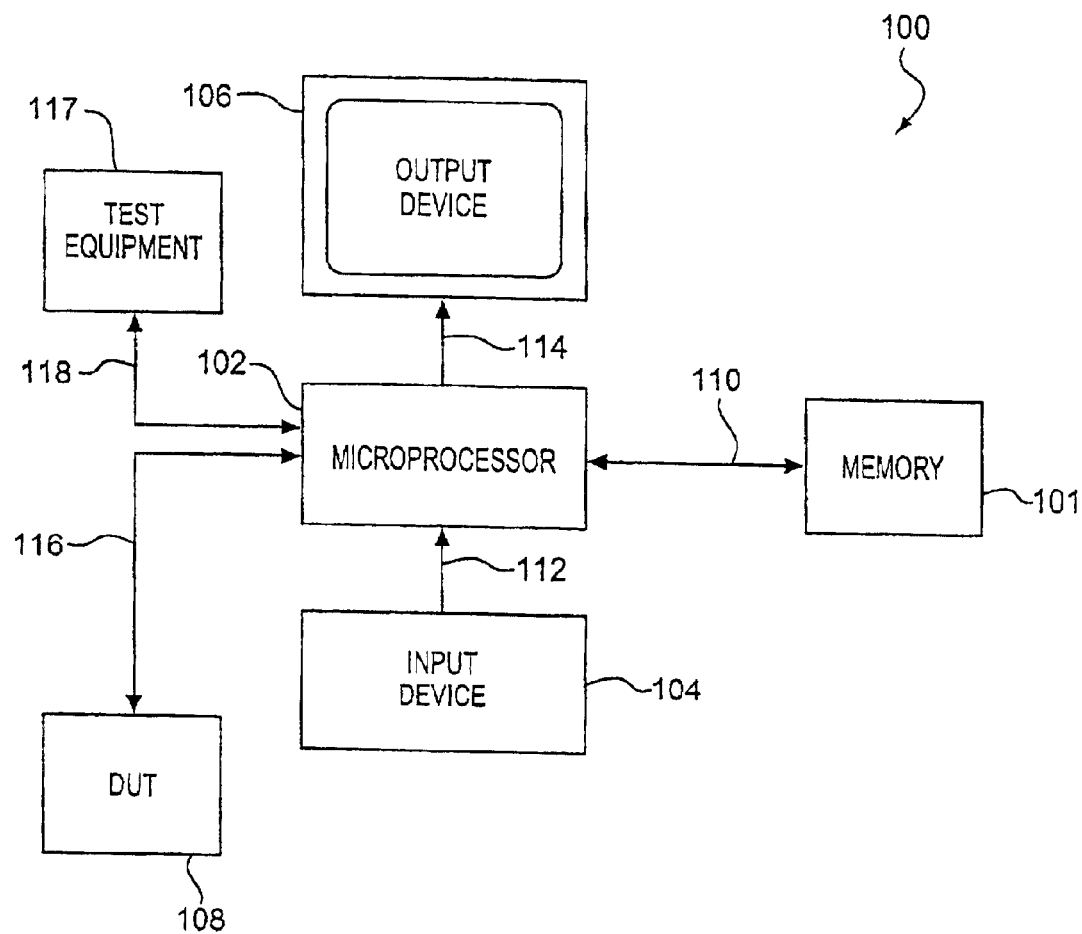
FIG. 1 illustrates a block diagram of hardware components that execute an electronic test program of a preferred embodiment of the present invention.

The present invention relates to an electronic test executive program. FIG. 1 illustrates a computer system 100 that executes a test executive program in accordance with this invention. Computer system 100 includes memory 101, microprocessor 102, input device 104, and output device 106. Memory 101 connects to microprocessor 102 via path 110. Memory 101 may be a non-volatile memory such as a Read Only Memory (ROM), a volatile memory such as a Random Access Memory (RAM), or any other suitable electronic memory device. Input device 104 connects to microprocessor 102 via path 112. Input device 104 may be a keyboard, mouse, joystick, or any other device and software driver that allows a user to input data.

In a preferred embodiment, the test executive program of this invention is stored as instructions in memory 101. Those skilled in the art will recognize that the instructions may either be stored as computer software and/or firmware that is readable and executable by microprocessor 102. The results for tests performed by the test executive program are displayed on output device 106. Output device 106 is a display and associated drivers that allow an application to display images to a user. Those skilled in the art will recognize that the display may be a conventional cathode ray monitor or Liquid Crystal Display (LCD). The actual display used does not matter for purposes of this invention.

Microprocessor 102 executes the test executive program of this invention. Microprocessor 102 communicates with a device under test (DUT) 108 via path 116 and with test equipment 117 via path 118. Signals received via paths 116 and 118 by microprocessor 102 are saved for use in memory 101.

One skilled in the art will recognize that this invention may be implemented by any electronic device having the same general configuration outline in FIG. 1. These electronic devices include, but are not limited to, a computer system, logic circuits embedded in hardware, and an electronic analyzer.

Figure 2:
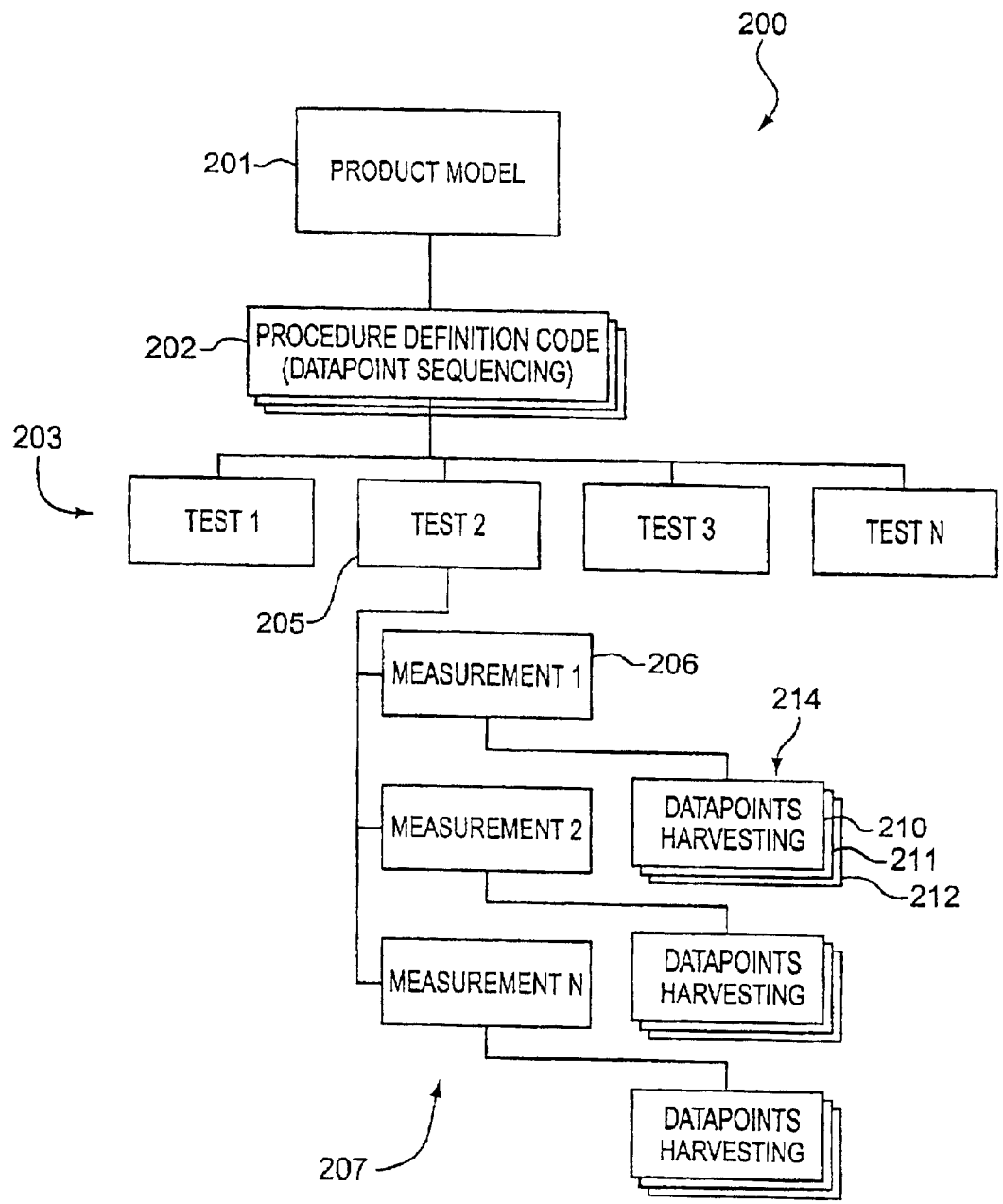
FIG. 2 illustrates a block diagram showing a hierarchical structure of a test executive program in accordance with this invention.

To better understand this invention, a hierarchical structure of a test executive program is described in FIG. 2. Block diagram 200 illustrates a hierarchical, multilevel structure of the preferred embodiment of a test executive program.

First level 201 corresponds to a product model which is a file that a test developer creates to test a family of specific device model numbers. This file contains test procedures and inputs. Second level 202 is a group of procedures. A procedure is an ordered list, sequence, or script of tests to be run on a device. Test 203 is the next level that includes tests 1–N to be run in each procedure 202. Each test 203 in turn includes a plurality of measurements to be taken during a test 203. For example, test 205 includes measurements 206. Each measurement 1–N includes one or more datapoints 214. For example, measurement 207 includes a datapoints 210–212.

Each procedure 202 is defined by a written program or a code used to build a structure of software objects. In one embodiment, the software objects are component object model, or COM, objects. COM is a language independent component architecture, not a programming language. COM is meant to be a general purpose, object-oriented structure to encapsulate commonly used functions and services.

A test 203 is a group of measurements in a procedure 202 that share a common testing algorithm or the same test software code. Some examples of tests 203 include, but are not limited to, an amplitude accuracy test, a test of harmonic distortion. Test executive program 200 repeatedly calls a test for each measurement and datapoint.

A measurement 207 is a configuration or a set up of a test. Each 207 within a test 203 can have different setup or configuration parameters. Tests 203 are parameter driven. Parameters are inputs at a measurement level. Measurements 207 are elements such as range in volts, frequency in kilohertz, or a harmonic (an integer number).

Each procedure 202 uses measurements 207 as data to be passed from the procedure to a test. A measurement 207 is also a phase of execution. During a measurement phase of execution of a test 203, a measurement 207 is started but data is not collected. Therefore, multiple DUTs 108 may be configured and tested concurrently. Test 205 and a second test 203 may include the same measurements 206. For example, test 205 tests amplitude accuracy for a voltage measurement and a frequency measurement. The second test checks an amplitude accuracy for a voltage measurement and a frequency measurement. There may also be a third test that tests harmonic distortion for a frequency measurement or harmonics of a signal.

Datapoints 210–212 are a subset of a measurement. These datapoints 210–212 include additional parameters that select a result when one measurement generates multiple results. For example, a measurement may have minimum and maximum datapoints for a spectrum analyzer sweep or different datapoints for each channel of a device. For each datapoint 210–212, a value result is determined. The value result is then compared to specification results. Specification results may include numerical limits, string match, and/or Boolean pass/fail results. There may be three different types of numerical limits including marginal limits, line limits, and customer limits. Each limit has an upper value and a lower value.

Figure 3:
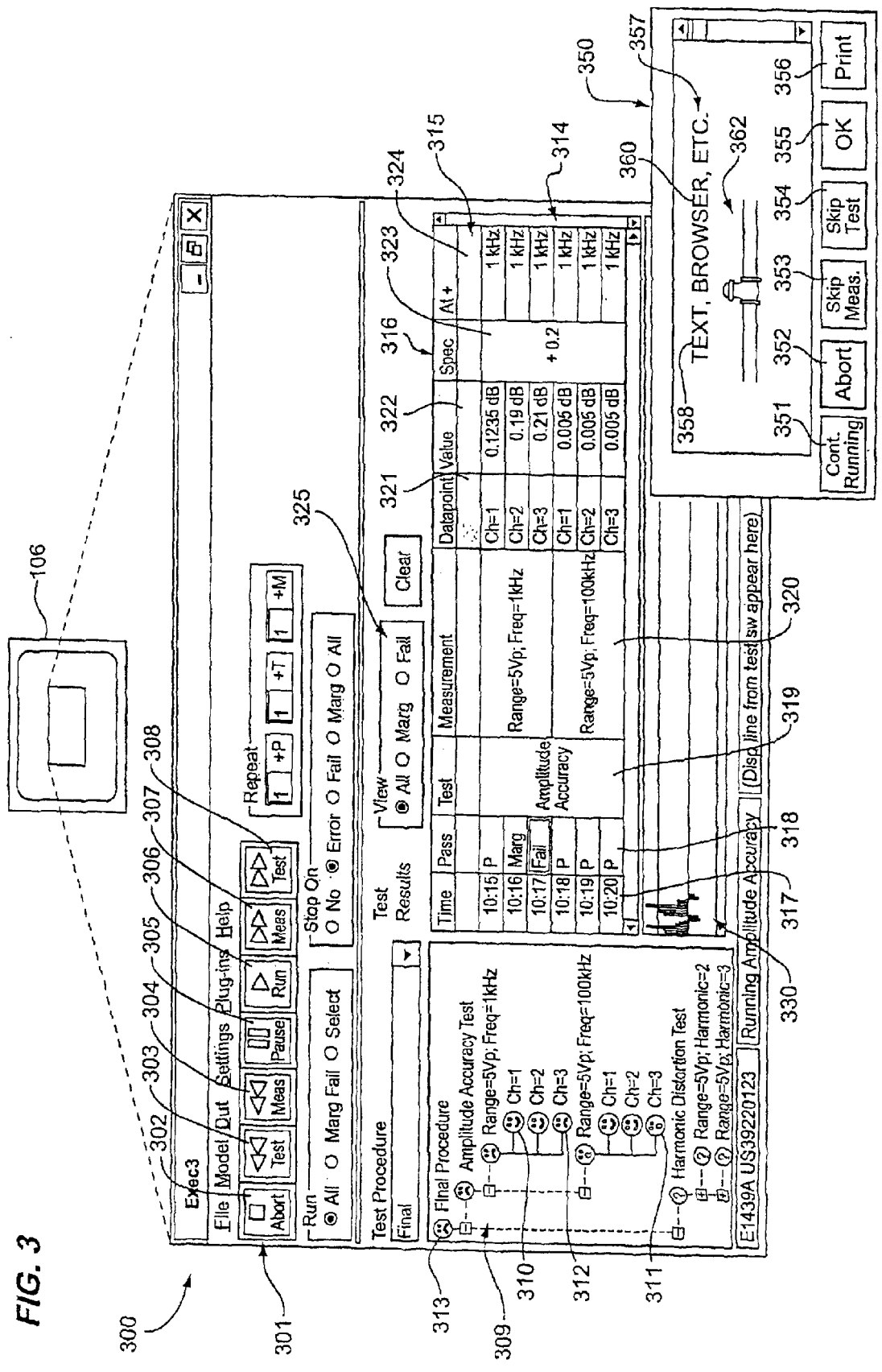
FIG. 3 illustrates a view of a graphical user interface (GUI) of an electronic executive test program and an interactive dialog box of the present invention.

All inputs and outputs of computer system 100 (FIG. 1) executing a test executive program are handled through a Graphical User Interface (GUI). FIG. 3 illustrates a GUI 300 as displayed by output device 106 in accordance with a test executive program of this invention. GUI 300 includes buttons 301 that are used to control a test. For convenience of the user, buttons 301 have indicia that indicate the function served by a button. For example, buttons 301 appear as tape recorder buttons in accordance with a preferred embodiment of this invention. In the preferred embodiment, these buttons include abort button 302, restart test button 303, restart measurement button 304, pause button 305, run button 306, skip measurement button 307, and skip test button 308. One skilled in the art will recognize that while tape recorder symbols are used in this embodiment, any number of different indicia may be used to identify buttons 301.

Area 314 on the right side of GUI 300 in the preferred embodiment is a display of test results. In the preferred embodiment, area 314 includes a series of rows 315 and columns 316 displaying results of individual tests. Column 317 indicates the time that a test is executed. Column 318 displays a status of the test. Column 319 also displays a name of a test. For example, one test is an amplitude frequency. Column 320 indicates a type of measurement being taken during a test. For example, range=5Vp; frequency=1 kHz. Column 321 displays the channel or datapoint under test. For example, ch=1 or ch=2. Column 322 displays a value or result of the test for a channel or datapoint. Column 323 displays a specification, such as +0.2. Column 324 displays a parameter such as 1 kHz.

Buttons 325 facilitate the filtering of displayed tests to allow a user to view desired tests. In the preferred embodiment, buttons 325 include an all button, a marginal pass button, and a fail button. However, one skilled in the art will recognize any number of additional ways to view the data may be added. Area 330 displays a progress bar that represents progress of a procedure being executed.

In the preferred embodiment, area 309 illustrates a test tree 313 that represents the tests being performed in a procedure area 309 which includes a hierarchy of tests, measurements, and datapoints. Test tree 313 includes icons that indicate a status of a test. The icons indicate pass, fail, marginal, and not-yet tested. In a preferred embodiment, a "smiley face" indicates a pass, a "surprised face" indicates a marginal pass, and a "frowning face" indicates a fail. The icon for the procedure indicates the status of the entire procedure, while icons for each test represent the status of an individual test. The icon for the procedure is determined by an algorithm that promotes the least optimal result. Thus, for example, fail has priority, and, if one test fails, the procedure fails.

There are times in a procedure that parameters must be changed, the configuration of the DUT 108 or the test equipment 117 that controls the DUT environment or other factors must be changed, important data must be displayed, testing equipment must be configured or other modifications or adjustments to the test must be made. For purposes of this discussion, the above occurrences are termed events. One skilled in the art will recognize that any occurrence that requires information necessary or useful for control of the system to be displayed to a user is an event.

Window 350 is a dialog box that appears when an event occurs to display testing information 357 for a user. Testing information 357 in general comprises directions for a user of the test executive system 100 to perform an action required to continue the test. The information, for example, may be instructions about the configuration of a DUT or equipment, data from a test, or explanation of a procedure and/or test. Window 350 may be a simple dialog box that displays a plain text file 358, an internet browser 360 that displays a file in a known internet protocol such as HTML. The information may include a web page 362 or other method of displaying a picture or diagram. Illustration 362 shown as an example illustrates a plumbing connection to be made, but may be any other information useful for control of the system. The display may also include sound information. Preferably, the directions are for a user to perform an action on DUT 108 or test equipment 117; that is, the directions are to perform an action on a device other than the test executive system itself.

Testing information 357 preferably includes one or more input command options, which preferably are presented as buttons 351–356. These buttons allow a user to input a command to the test executive program to respond to the window. In a preferred embodiment, buttons 351–356 include continue running button 351, abort button 352, skip measurement button 353, skip test button 354, acknowledgement button 355, and print button 356. A user produces an input by activating one of these buttons to respond to the window. One skilled in the art will recognize that these options may be presented in many other ways.

Figure 4:
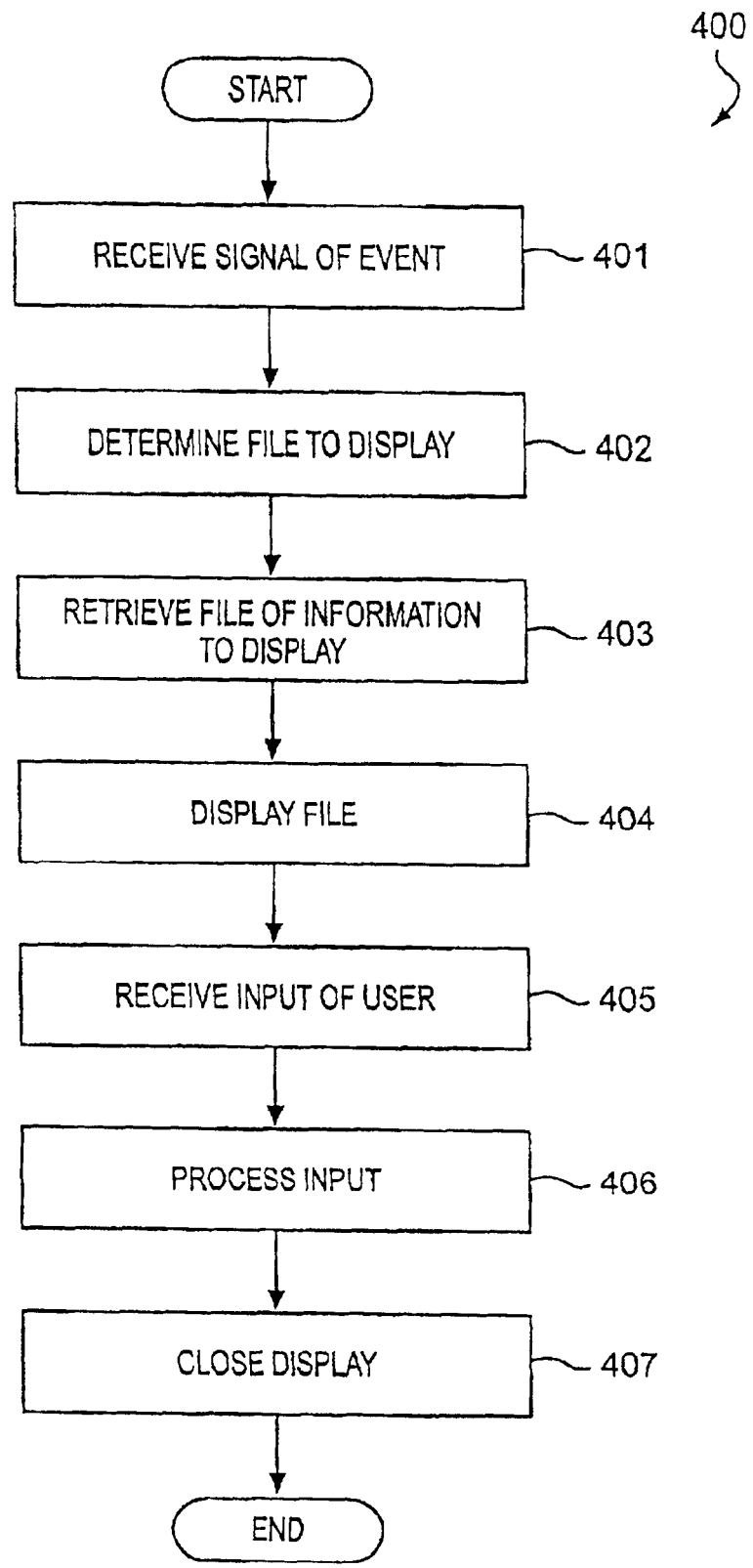
FIG. 4 illustrates a flow diagram for an application of a first preferred embodiment of a test program in accordance with this invention.
Figure 5:
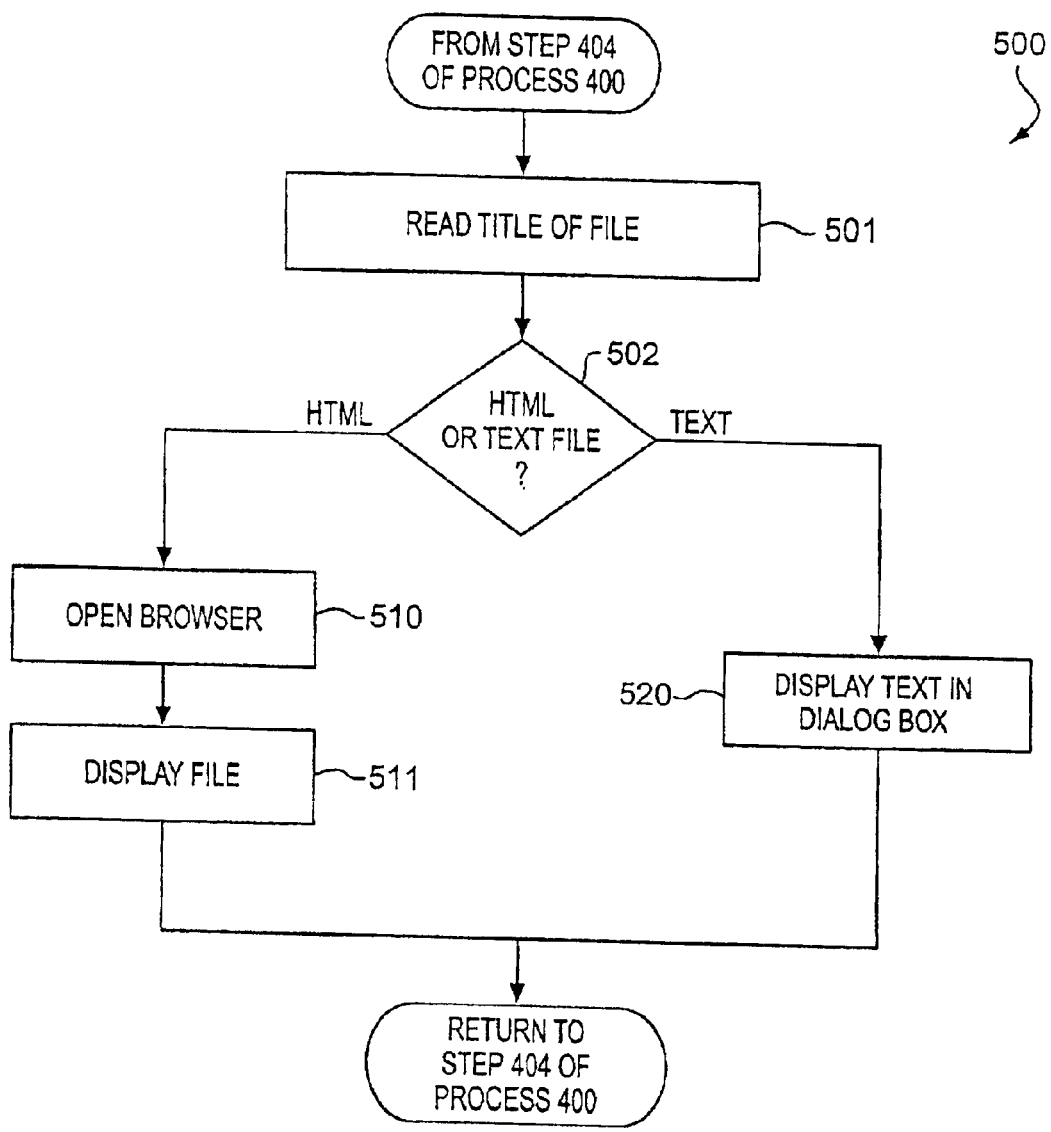
FIG. 5 illustrates a flow diagram of an application for displaying a file in the first preferred embodiment of this invention.
Figure 6:
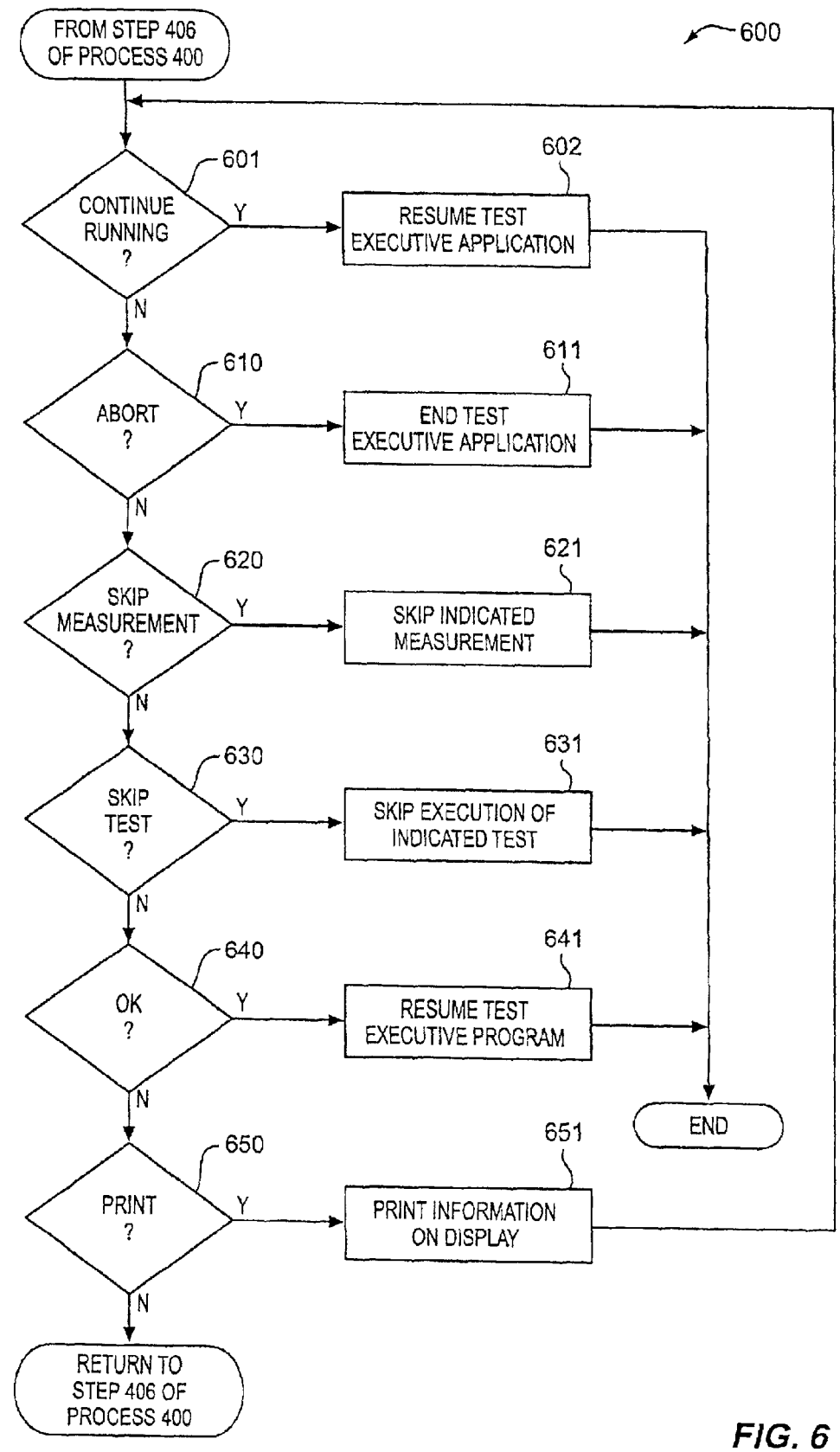
FIG. 6 illustrates a flow diagram for an application for processing an input in accordance with the first preferred embodiment of this invention.

FIGS. 4–6 are flow diagrams of the operations executed by the test executive program to display a window 350 and present an interactive opportunity to the user in accordance with this invention. One skilled in the art will recognize that the acts shown in the flow diagrams of FIGS. 4–6 can be programmed in any number of programming languages including C, C++, SQL, Visual basic, or other languages that provide the functionality needed.

FIG. 4 illustrates a flow diagram of a process 400 executed by a test executive program to provide a dialog box of window 350 (FIG. 3) in accordance with the invention. Process 400 begins at 401 by processor 102 receiving a signal from the test executive program that an event has occurred. At 402, process 400 determines the proper file to display in response to the event and at 403, process 400 retrieves the file with the information to display. The file is then displayed at 404. After the file is displayed, process 400 waits and receives an input 405 from the user. This input may be a direct input, such as is directed to the processor when the user activates one of buttons 351–356; or the input may be indirect, such as when the user adjusts or modifies test equipment 117, DUT 108 or system 100 and the processor receives an input that the required adjustment or modification has been made. In act 406, the input is processed. At 407, the display closes and process 400 ends.

FIG. 5 illustrates a process 500 that displays the file in 404 of process 400. Process 500 begins at 501 by reading a title of the file that includes the information to display, or processes other data indicative of the type of file that is to be processed. At 502, the type of file including the information is determined. In a preferred embodiment, act 502 determines whether the file is an HTML file or a text file. If the file is an HTML file, an Internet browser application is opened in 510 and the browser displays the desired file in act 511. If the file is a text file, the file is displayed as text in a dialog box in act 520. After act 511 or act 520, process 500 ends and returns to act 404 of process 400.

FIG. 6 illustrates a preferred embodiment of process 600 executed in act 406 of process 400 to process an input. One skilled in the art will recognize that other actions may be checked and some of the actions shown may be omitted depending on the window being displayed and/or the design requirements of the test executive program. One skilled in the art will also recognize that the input may be a mouse click on a button, strokes on a keyboard, or any other input of a command.

Process 600 begins in act 601 by determining whether the input is for continue running command. If the input is a continue running command, process 600 resumes the test executive program from the point that the event occurred in act 602 and process 600 ends. In act 610, process 600 determines whether an input signal and abort command is received. If an abort command is received, process 600 ends the test executive program in act 611 and process 600 ends.

If the input is not an abort command, process 600 determines whether the input is a skip measurement command in act 620. If the input is a skip measurement command, process 600 skips the measurement immediately following the event in act 621.

If the input is not a skip measurement command, process 600 determines whether the input is a skip test command in act 630. If the input is a skip test command, process 600 does not execute the test following the event in act 631.

If the input is not a skip test command, process 600 determines whether the input is an "O.K." command. If the input is an "O.K." command, process 600 resumes the test executive application in act 641 and process 600 ends.

If the input is not an "O.K." command, process 600 determines whether the input is a print command. If the input is a print command, process 600 transmits a print request for the displayed text to an attached printer. Process 600 then ends. Alternatively, process 600 waits for a second input after-receiving an input of a print command.

The above is a description of a test executive program that includes an interactive window for displaying information. Those skilled in the art will recognize that alternative systems may be designed that infringe this invention as set forth in the claims below either literally or through the Doctrine of Equivalents.

What is claimed is:

1. A product that provides a test executive system for controlling a test upon a device Under test that is distinct and separate from said test executive system, said product comprising:

instructions for directing a processing unit to:

receive a signal that an event in a testing procedure occurs;

retrieve testing information responsive to said signal, said testing information comprising directions for a user of said test executive system to perform an action on equipment controlling the environment of said device under test, said action being required to continue said test;

display said testing information;

receive an input;

process said input responsive to receiving said input; and close said display responsive to processing said input; and a media readable by said processing unit that stores said instructions.

2. A product that provides a test executive system for controlling a test upon a device under test that is distinct and separate from said test executive system, said product comprising:

instructions for directing a processing unit to:

receive a signal that an event in a testing procedure occurs;

retrieve testing information responsive to said signal, said testing information comprising directions for a user of said test executive system to perform an action on equipment controlling the environment of said device under test, said action being required to continue said test, and said testing information including an abort command input option;

display said testing information;

receive an input; and process said input responsive to receiving said input, said processing including directing said processing unit to terminate said test being performed by said test executive program responsive to receiving said abort command; and a media readable by said processing unit that stores said instructions.

3. A product that provides a test executive system for controlling a test upon a device under test that is distinct and separate from said test executive system, said product comprising:

instructions for directing a processing unit to:

receive a signal that an event in a testing procedure occurs;

retrieve testing information responsive to said signal, said testing information comprising directions for a user of said test executive system to perform an action on equipment controlling the environment of said device under test, said action being required to continue said test, and said testing information including a skip measurement command input option;

display said testing information;

receive an input; and process said input responsive to receiving said input, said processing including directing said processing unit to skip a measurement during a test executed by said test executive program responsive to receiving said skip measurement command; and a media readable by said processing unit that stores said instructions.

4. A product that provides a test executive system for controlling a test upon a device under test that is distinct and separate from said test executive system, said product comprising:

instructions for directing a processing unit to:
  receive a signal that an event in a testing procedure occurs;
  retrieve testing information responsive to said signal, said testing information comprising directions for a user of said test executive system to perform an action on equipment controlling the environment of said device under test, said action being required to continue said test, and said testing information including an O.K. command input option;
  display said testing information;
  receive an input; and
  process said input responsive to receiving said input, said processing including directing said processing unit to resume said test executive program responsive to receiving said O.K. command; and
a media readable by said processing unit that stores said instructions.

5. A product that provides a test executive system for controlling a test upon a device under test that is distinct and separate from said test executive system, said product comprising:
instructions for directing a processing unit to:
  receive a signal that an event in a testing procedure occurs;
  retrieve testing information responsive to said signal, said testing information comprising directions for a user of said test executive system to perform an action on equipment controlling the environment of said device under test, said action being required to continue said test, and said testing information including a print command input option;
  display said testing information;
  receive an input; and
  process said input responsive to receiving said input, said processing including directing said processing unit to print said display of test information responsive to receiving said print command; and
a media readable by said processing unit that stores said instructions.

6. A product that provides a test executive system for controlling a test upon a device under test that is distinct and separate from said test executive system, said product comprising:
instructions for directing a processing unit to:
  receive a signal that an event in a testing procedure occurs;
  retrieve testing information responsive to said signal, said testing information comprising directions for a user of said test executive system to perform an action required to continue said test, and said testing information comprising instructions for performing an operation on equipment controlling the environment of said device under test;
  display said testing information;
  receive an input; and
  process said input responsive to receiving said input; and
a media readable by said processing unit that stores said instructions.

7. A method of operating a test executive system for controlling a test upon a device under test that is distinct and separate from said test executive system comprising:
receiving a signal that an event in a testing procedure occurs;
retrieving testing information responsive to said signal, said testing information comprising directions for a user of said test executive system to perform an action on equipment controlling the environment of said device under test, said action being required to continue said test;
displaying said testing information;
receiving an input;
processing said input responsive to receiving said input; and
closing said display responsive to processing said input.

8. A method of operating a test executive system for controlling a test upon a device under test that is distinct and separate from said test executive system comprising:
receiving a signal that an event in a testing procedure occurs;
retrieving testing information responsive to said signal, said testing information comprising directions for a user of said test executive system to perform an action on equipment controlling the environment of said device under test, said action being required to continue said test;
displaying said testing information, including at least one input option selected from the group consisting of: an abort command, a skip measurement command, an O.K. command, and a print command;
receiving an input; and
processing said input responsive to receiving said input, said act of processing said input comprising an act selected from the group consisting of: terminating said test being performed by said test executive program responsive to receiving said abort command, skipping a measurement during a test executed by said test executive program responsive to receiving said skip measurement command, resuming said test executive program responsive to receiving said O.K. command, and printing said display of test information responsive to receiving said print command.

9. A method of operating a test executive system for controlling a test upon a device under test that is distinct and separate from said test executive system comprising:
receiving a signal that an event in a testing procedure occurs;
retrieving testing information responsive to said signal, said testing information comprising directions for a user of said test executive system to perform an action required to continue said test, and said testing information comprising instructions for performing an operation on equipment controlling the environment of said device under test;
displaying said testing information;
receiving an input; and
processing said input responsive to receiving said input.

10. A product that provides a test executive system for controlling a test upon a device under test that is distinct and separate from said test executive system, said product comprising:
instructions for directing a processing unit to:
  receive a signal that an event in a testing procedure occurs;
  retrieve testing information responsive to said signal, said testing information comprising directions for a user of said test executive system to perform an action on equipment controlling the environment of said device under test, said action being required to continue said test;

display said testing information by determining a format in which said testing information is stored, and executing an application that displays said testing information in said format;

receive an input; and process said input responsive to receiving said input; and a media readable by said processing unit that stores said instructions.

11. The product of claim 10 wherein said format of said testing information is HTML and said instructions to display said testing information by executing an application comprise instructions for directing said processing unit to open a web browser application to retrieve and display said testing information.

12. The product of claim 10 wherein said format of said testing information is ASCII text and wherein said instructions to display said testing information by executing an application comprise instructions for directing said processing unit to open a dialog box that can display ASCII text.

13. A method of operating a test executive system for controlling a test upon a device under test that is distinct and separate from said test executive system comprising:

receiving a signal that an event in a testing procedure occurs;

retrieving testing information responsive to said signal, said testing information comprising directions for a user of said test executive system to perform an action on equipment controlling the environment of said device under test, said action being required to continue said test;

displaying said testing information by determining a format in which said testing information is stored, and executing an application that displays said testing information in said proper format;

receiving an input;

processing said input responsive to receiving said input.

14. The method of claim 13 wherein said format of said testing information is HTML and said act of executing said application comprises opening a web browser application to retrieve and display said testing information.

15. The method of claim 13 wherein said format is ASCII text and said act of executing said application comprises opening a dialog box that displays ASCII text.

* * * * *

UNITED STATES PATENT AND TRADEMARK OFFICE
CERTIFICATE OF CORRECTION

PATENT NO.   : 6,807,506 B2
DATED        : October 19, 2004
INVENTOR(S)  : Christopher K. Sutton and Richard Mills It is certified that error appears in the above-identified patent and that said Letters Patent is hereby corrected as shown below:

Column 4,
Line 41, after "includes", delete "a"
Line 57, after "each", insert therefor -- measurement --

Column 7,
Line 53, before "process", delete "Altermatively" and insert therefore -- Alternatively --

Signed and Sealed this

Third Day of May, 2005

JON W. DUDAS
*Director of the United States Patent and Trademark Office*